(12) United States Patent
Zadražil et al.

(10) Patent No.: US 8,779,368 B2
(45) Date of Patent: Jul. 15, 2014

(54) SCINTILLATION DETECTION UNIT FOR THE DETECTION OF BACK-SCATTERED ELECTRONS FOR ELECTRON OR ION MICROSCOPES

(75) Inventors: Martin Zadražil, Brno (CZ); Silvie Dokulilova, Brno (CZ); Karel Blažek, Turnov (CZ); Petr Horodyský, Moravany (CZ)

(73) Assignees: Tescan Orsay Holding, A.S., Brno (CZ); Crytur, Spol, S.R.O., Turnov (CZ)

( * ) Notice: Subject to any disclaimer, the term of this patent is extended or adjusted under 35 U.S.C. 154(b) by 0 days.

(21) Appl. No.: 13/877,454

(22) PCT Filed: Oct. 6, 2011

(86) PCT No.: PCT/CZ2011/000098
§ 371 (c)(1),
(2), (4) Date: Apr. 3, 2013

(87) PCT Pub. No.: WO2012/045291
PCT Pub. Date: Apr. 12, 2012

(65) Prior Publication Data
US 2013/0187055 A1  Jul. 25, 2013

(30) Foreign Application Priority Data
Oct. 7, 2010  (CS) ..................................... 2010-731

(51) Int. Cl.
*G01T 1/20* (2006.01)

(52) U.S. Cl.
CPC ...................................... *G01T 1/20* (2013.01)
USPC ........................................................ 250/368

(58) Field of Classification Search
CPC . H01J 2237/2243; G01T 1/20; G01T 1/2018; G01T 3/06; G01T 1/2002
USPC ......................................................... 250/368
See application file for complete search history.

(56) References Cited

U.S. PATENT DOCUMENTS 4,177,379 A * 12/1979 Furukawa et al. ............ 250/306
4,551,625 A * 11/1985 Lischke et al. ............... 250/310
(Continued)

FOREIGN PATENT DOCUMENTS

EP   0105440 A2   4/1984
EP   0561584 A1   9/1993
(Continued)

OTHER PUBLICATIONS

International Search Report (PCT/ISA/210) issued on Feb. 16, 2012, by the European Patent Office as the International Searching Authority for International Application No. PCT/CZ2011/000098.

(Continued)

*Primary Examiner* — Kiho Kim
(74) *Attorney, Agent, or Firm* — Buchanan Ingersoll & Rooney PC

(57) ABSTRACT

A scintillation detection unit for the detection of back-scattered electrons for electron and ion microscopes, in which the scintillation detection unit consists of body and at least one system for processing the light signal, where the body is at least partly made of scintillation material and is at least partly situated in a column of an electron or ion microscope and is made up of at least one hollow part. The height of the body of scintillation detection unit measured in the direction of longitudinal axis is greater than one-and-a-half times the greatest width measured in the direction perpendicular to the longitudinal axis of the hollow part with the greatest width. The walls of the hollow parts are vacuum-sealed in the areas outside bottom holes and top holes and make up part of a vacuum-sealed jacket which is passed through by the primary beam of electrons.

15 Claims, 7 Drawing Sheets

(56) References Cited

U.S. PATENT DOCUMENTS

| | | | | |
|---|---|---|---|---|
| 4,700,075 | A * | 10/1987 | Kurz et al. | 250/368 |
| 4,831,267 | A * | 5/1989 | Brunner | 250/397 |
| 7,531,812 | B2 | 5/2009 | Slowko | |
| 7,659,514 | B2 * | 2/2010 | Adamec | 250/368 |
| 7,714,287 | B1 | 5/2010 | James et al. | |
| 7,872,236 | B2 * | 1/2011 | Zhang et al. | 250/368 |
| 2005/0139789 | A1 | 6/2005 | Nagano et al. | |

FOREIGN PATENT DOCUMENTS

| | | |
|---|---|---|
| WO | 9840906 A1 | 9/1998 |
| WO | 2005036583 A2 | 4/2005 |
| WO | 2008058491 A2 | 5/2008 |
| WO | WO 2010/008307 A2 | 1/2010 |

OTHER PUBLICATIONS

Written Opinion (PCT/ISA/237) issued on Feb. 16, 2012, by the Japanese Patent Office as the International Searching Authority for International Application No. PCT/CZ2011/000098.

Wandrol, P. et al., "High Resolution Imagining by Means of Backscattered Electrons in the Scanning Electron Microscope", Materials Science Forum, vol. 567-568, Jun. 12, 2007 (pp. 313-316).

Notification of Transmittal of the International Search Report and the Written Opinion of the International Searching Authority, or the Declaration (PCT/ISA/220), PCT International Search Report (PCT/ISA/210), Written Opinion of the International Searching Authority (Form PCT/ISA/237) issued on Feb. 16, 2012, in corresponding International Application No. PCT/CZ011/000098. (7 pages).

Czech Republic Search Report dated Aug. 6, 2011, issued by the Industrial Property Office of the Czech Republic in corresponding Czech Republic Patent Application No. PV 2010-731. (3 pages).

Jaksch, H. et al., "New Detection Principles and Developments on the GEMINI SUPRA FE-SEM", Abstract of MC2008, Microanal., vol. 9 (Suppl. 3), 106, 2003, (2 pages).

Jaksch, H., and J. P. Vermeulen. "New Developments in GEMINI® FESEM Technology," *Microscopy Today* 13 (2005), 2 pages.

\* cited by examiner

SCINTILLATION DETECTION UNIT FOR THE DETECTION OF BACK-SCATTERED ELECTRONS FOR ELECTRON OR ION MICROSCOPES

FIELD OF THE INVENTION

The presented invention concerns the scintillation detection unit for the detection of back-scattered electrons whereby the detection takes place at least partly in the column of an electron or ion microscope.

DESCRIPTION OF THE PRIOR ART

Modern electron microscope applications require increasingly greater resolution. One of the possible solutions for enhancing this parameter is reducing the working distance (WD) between the sample and the objective lens.

However, with too small WD a problem arises concerning the location of some detectors and the resulting lowering of the level of the detected signal, which also applies to the detector of back-scattered electrons, or BSE detector.

Most frequently the BSE detector has the form of a disc from scintillation or semiconductor material (e.g. U.S. Pat. No. 4,700,075), whereby the disc is situated below the lower polepiece of the objective lens, i.e. between the sample and the objective lens. Hence, the thickness of the disc restricts the shortest achievable WD, as it prevents the sample from coming closer to the objective lens. In addition the disc must be fitted with a hole for the passage of the primary electron beam, which, given a shorter distance between the sample and the detector, significantly reduces detection efficiency. This is because the greatest number of BSE, when the primary beam impinges almost perpendicularly, head upwards into the solid angle surrounding the longitudinal axis of the primary beam and with a small distance between the sample and the detector most of the electrons fly through the hole in the disc without being registered by the detector. The optimum level of signal is achieved with a medium-distance WD, when the area of the intersection of the solid angle with the greatest density of BSE with the detector surface is the largest.

The above problems result in attempts to place detectors, including the BSE detector, directly into the column of the electron microscope, as described for example in the article by Jaksch, Steigerwald, Drexel and Bihr entitled Instrumentation and Methods—Advances in SEM and LEEM—New Detection Principles and Developments on the GEMINI SUPRA FE-SEM, published in Microscopy and Microanalysis (2003), 9:106-107CD Cambridge University Press, to or a similar article written by H. Jaksch, J-P Vermeulen, appearing under the title New Developments in GEMINI® FESEM Technology in a publication by Carl Zeiss SMT Oberkochen, Germany. In this application the BSE detector, situated in the column of the apparatus also has the form of a disc, whereby its active surface, onto which the majority of the detected electrons impinge, is perpendicular to the optical axis of the device.

The disadvantage of this and similar solutions is that on a surface perpendicular to the optical axis of the device, BSE are detected with low efficiency. The explanation is that a BSE beam, after being focused by the objective lens, on the way upwards diverges and is additionally deflected by scanning coils. For constructional reasons the disc tends to be mostly situated in an area where electrons, after being focused by the objective lens, diverge in a very significant way. As a result, before BSE reach the disc, a relatively large number are "lost" by being captured on other parts of the device, which reduces detection efficiency. The detected electrons are only those whose trajectories cut through the surface of the disc perpendicular to the optical axis of the device, i.e. in the case of a sample that is not tilted only electrons emitted from the sample at great angles, almost perpendicular to the sample plane, are detected. This precondition limits the angle and energy range of the detector. Even supposing the disc is successfully placed relatively low in the column, there are losses with this solution. When the disc is situated very low, BSE flying through the hole on the disc made for the passage of the primary beam become lost, and there are relatively many BSE in this area. Equally, when having a disc that is tilted relative to the optical axis of the device, detection is less efficient compared to the submitted invention. Moreover, this type of solution does not allow for angle and elevation separation of the detected electrons. According to the above referenced article, New Detection Principles and Developments on the GEMINI SUPRA FE-SEM, an additional detector is proposed for capturing BSE emitted from the sample at small angles, i.e. almost tangentially to its surface, which, however, is not mounted in the column of the electron microscope, but in a chamber below the objective lens of the microscope, leading again to unwelcome spatial restrictions, an increase in the shortest achievable WD and resulting in lower resolution. Even with simultaneous application of a BSE detector below the objective lens and a disc-shaped BSE detector in the column, great losses continue to occur, as part of the emitted BSE fails to be registered by either detector.

There are other solutions with a detector or detectors in the column of a microscope; however, they are too remote from the presented invention. For example, in patent application WO 201000837 A by inventor Slowko Witold and applicant POLITECHNIKA WROCLAWSKA, a detector, primarily of secondary electrons (SE), is described designed for operation in a low-vacuum mode up to a pressure of 1000 Pa. SE detection is supported by a system of electrodes. One of these electrodes is a rotationally symmetrical anode, which is supplied with voltage, typically around 1 kV, and coated with a thin scintillator layer where the SE signal is converted to light. This is subsequently (optionally after passing through a lightguide) detected by a photodetector, often a photomultiplier. This SE detection principle (anode, scintillator, lightguide and photomultiplier) has been a generic, well- and long-known technology. The invention of Witold Slowko mainly concentrates on the proper working of the whole system—with diaphragms separating areas with different pressures and electrodes with appropriate voltage—in a low-vacuum mode.

The system in application WO 201000837 A is described as having an additional BSE detector, being a commonly known Robinson-type detector consisting of a scintillator disc with a hole for the passage of the primary beam in the centre, coated with a conductive layer, a lightguide and a photodetector.

SUMMARY OF THE INVENTION

The above-mentioned disadvantages are eliminated by a scintillation detection unit for the detection of back-scattered electrons for electron or ion microscopes having a column with a longitudinal axis. The scintillation detection unit is made up of the body and at least one system for processing the light signal that may consist of either a sole photodetector or a photodetector preceded by additional optical members. The system inlet is situated in close vicinity to the body of the scintillation detection unit. The body is at least partly made of scintillation material, it is at least partly mounted inside the column of an electron or ion microscope and is made up of at least one hollow part. The nature of the novel solution consists in the fact that the height of the body of the scintillation detection unit measured along the direction of the longitudinal axis is greater than one-and-a-half times the greatest width measured in the direction perpendicular to the longitudinal axis of the hollow part with the greatest width. In the case of using multiple hollow parts making up the body, its height in the direction of the longitudinal axis is given by the sum of the projections of the hollow parts employed on the longitudinal axis, where in the case that some of the projections overlap, the overlapping sections are added to the overall height only once. The lower base of each hollow part is fitted with bottom holes and the upper base is fitted with top holes for the passage of the primary beam of charged particles. The longitudinal axis passes through the hollow space of the hollow parts and their bottom and top holes. The surface layers of the hollow part adjacent to the longitudinal axis are either completely made of an active scintillating layer, or the active scintillating layer is at least partly applied to the surfaces of the hollow parts. The lower end of the body of the scintillation detection unit is situated above the examined sample.

In an alternative design, the walls of the hollow parts are vacuum-sealed in the areas outside the bottom and the top holes and constitute part of the vacuum-sealed jacket around the longitudinal axis passed through by the primary beam of electrons.

Each of the hollow parts can be assigned more than one system for processing the light signal.

Another possibility is that at least one of the hollow parts is provided with grooves where the longitudinal axis of each of the grooves is in the plane passing through the longitudinal axis of the column. The grooves divide the corresponding hollow part into several segments and each of the segments is assigned its own system for the processing of the light signal. It is beneficial when the surface of the grooves is coated with the second reflection layers that exhibit at least 30% reflectivity towards the segments of the corresponding hollow part in the spectral region in which the scintillation material used on the corresponding hollow part radiates.

In another possible design the active scintillating layer on the surface of at least one of the hollow parts is axially symmetrical relative to the longitudinal axis.

The hollow parts can also be at least partly optically shielded from one other.

This optical shield is implemented, for example, by means of the third reflection layers, the reflectivity of which is at least 30% in the spectral region, in which the scintillation material of the hollow part that is adjacent to the given reflective layer radiates.

The hollow parts can be made up of scintillation material, an integral part of which is an active scintillating layer and/or substrate from light-conducting material, the inner surface of which is coated by a layer of scintillation material constituting the active scintillating layer. The scintillation materials and/or substrates and/or layers of scintillation material can be different in at least two of the hollow parts.

When the hollow body is made up of scintillation material, an integral part of which is an active scintillating layer, the surfaces adjacent to the longitudinal axis of the column can benefit from being polished.

Another variant is that the active scintillating layer is coated, on the side adjacent to the longitudinal axis, with an electrically conductive layer or an electrically conductive grid for the removal of surface charge.

In yet another design, at least some areas of the walls of at least one hollow part on the reverse side from the longitudinal axis are coated with the first reflective layer, with reflectivity optimised for the wavelength of the emission of the scintillation material used for this hollow part. This first reflective layer has the third holes in areas oriented opposite the inlet of each of the systems for processing the light signal.

Another variation is that at least some areas of the walls of at least one hollow part on the reverse side from the longitudinal axis are tightly coated with a dielectric reflective layer with reflectivity optimised for the wavelength of the emission of the scintillation material used for this hollow part. This dielectric reflective layer has the second holes in areas oriented opposite the inlet of each of the systems for processing the light signal.

At least some areas of the walls of at least one hollow part on the reverse side from the longitudinal axis can also be polished.

In another possible design, at least some areas of the walls of at least one hollow part on the reverse side from the longitudinal axis are surrounded by reflective material with reflectivity of at least 30% in the spectral region in which the given scintillation material radiates. In this case there is gap between the walls of the particular hollow part on the reverse side form the longitudinal axis and the reflective material filled by the existing environment in the column, typically vacuum or partially evacuated. This reflective material has the first holes in the areas oriented opposite the inlet of each of the systems for the processing of the light signal. It is beneficial to use reflective material on the basis of dielectric layers.

It is beneficial when the external surface of the relevant hollow part in the areas oriented opposite the inlet of each of the systems for the processing of the light signal is matt.

Compared to the known solutions mentioned in the state of the art section, the essential fact concerning the presented invention is that the height of the body of the scintillation detection unit measured in the direction of the longitudinal axis of the column is greater than one-and-a-half time the greatest width of the body of the scintillation unit measured in the direction perpendicular to this axis. This permits efficiently detecting even BSE that detectors of the disc type, which do not fit the parameters described above, fail to register.

Regarding WO 201000837 A, the presented solution substantially differs from the referenced one, as it is not concerned with a low-vacuum mode or SE detection. It does not therefore need an anode for detection, only one or multiple hollow parts from scintillation material, which are not supplied with voltage. What is essential is the geometrical parameters of the given hollow part. BSE detection in the way mentioned in WO 201000837 A only places the well-known Robinson detector on the bottom section of the objective lens, whereby, in a similar way as in the solution proposed in U.S. Pat. No. 4,700,075 or in the article by Jaksch, J-P Vermeulen: New Developments in GEMINI® FESEM Technology, the greatest part of the detected BSE is captured on the surface of the disc perpendicular to the optical axis of the apparatus, which is the source of all the disadvantages mentioned in the comment regarding patent U.S. Pat. No. 4,700,075 and the article by Jaksch, J-P Vermeulen: New Developments in GEMINI® FESEM Technology.

The main principle of the invention consists in the new design of the shape of the detector body, which, from the space above the sample and, most frequently, from the objective lens upwards, is made up of hollow parts with active layers for BSE detection on the sides adjacent to the longitudinal axis of the column, whereby the sum of the projections of the hollow parts on the longitudinal axis of the column is at least one-and-a-half times greater than the greatest width of the hollow parts used measured in the plane perpendicular to the longitudinal axis of the column. In the case that in some of the hollow parts their projections on the longitudinal axis of the column overlap, the overlapping sections are added to the sum of the projections only once. The widest hollow part is the one that has the greatest width parameter. This means that the detection surface surrounding the axis of the column in the upward direction is relatively large, and as a result it is possible to detect BSE over a relatively long section along the axis, which represents a great advantage compared to scintillation detectors in the form of a disc. Large quantities of BSE impinge on the hollow of the detection unit body in this long section along the axis of the column at different heights—these are the BSE that would otherwise end up unused on different parts of the equipment before they could impinge on the scintillation disc with the main detection surface perpendicular to the axis of the apparatus situated at a greater height above the lens. The proposed solution makes it possible to capture, on the hollow of the detection unit body, even these BSE that would otherwise remain unused, such as those that leave the sample at smaller angles relative to the plane of the sample—if the sample is not tilted and is in the plane perpendicular to the optical axis of the apparatus—or BSE with lower energy. When the disc is situated in a low position, due to the BSE flying through the hole that is necessary for the passage of the primary beam, there are significant losses of BSE which leave the sample at great angles relative to the plane of the untilted sample and which make up the greatest part of emitted BSE. In addition, the position of the disc low above the objective lens is difficult in terms of constructional design.

In the presented solution the overall yield is, therefore, significantly higher than in all the so far known and used systems thanks to the selected geometry of the detection unit body, including equipment which employs the configuration with a disc, which is not perpendicular to the axis of the column, as the active area at the walls of the hollow part with the proposed parameters is always larger and/or more suitably positioned than in the disc-type solution.

Another advantage of the proposed solution is the great energy and angle range of the detection unit. Moreover, this design of the detection unit body can be used with benefit as part of a vacuum-sealed jacket, which is passed through by the primary beam of electrons. Ideally, even the inner walls of the hollow parts are vacuum-sealed, although it may suffice when only one of the material layers applied to the hollow parts is sealed. More complex arrangements of the detector body enable separation of the captured electrons by height and/or angle.

In the making of the body of the presented detection unit it is beneficial to opt for scintillation materials.

OVERVIEW OF FIGURES IN DRAWINGS

Examples of the design of the scintillation detection unit for the detection of back-scattered electrons for electron or ion microscopes are schematically depicted in the attached drawings.

Figure 3:
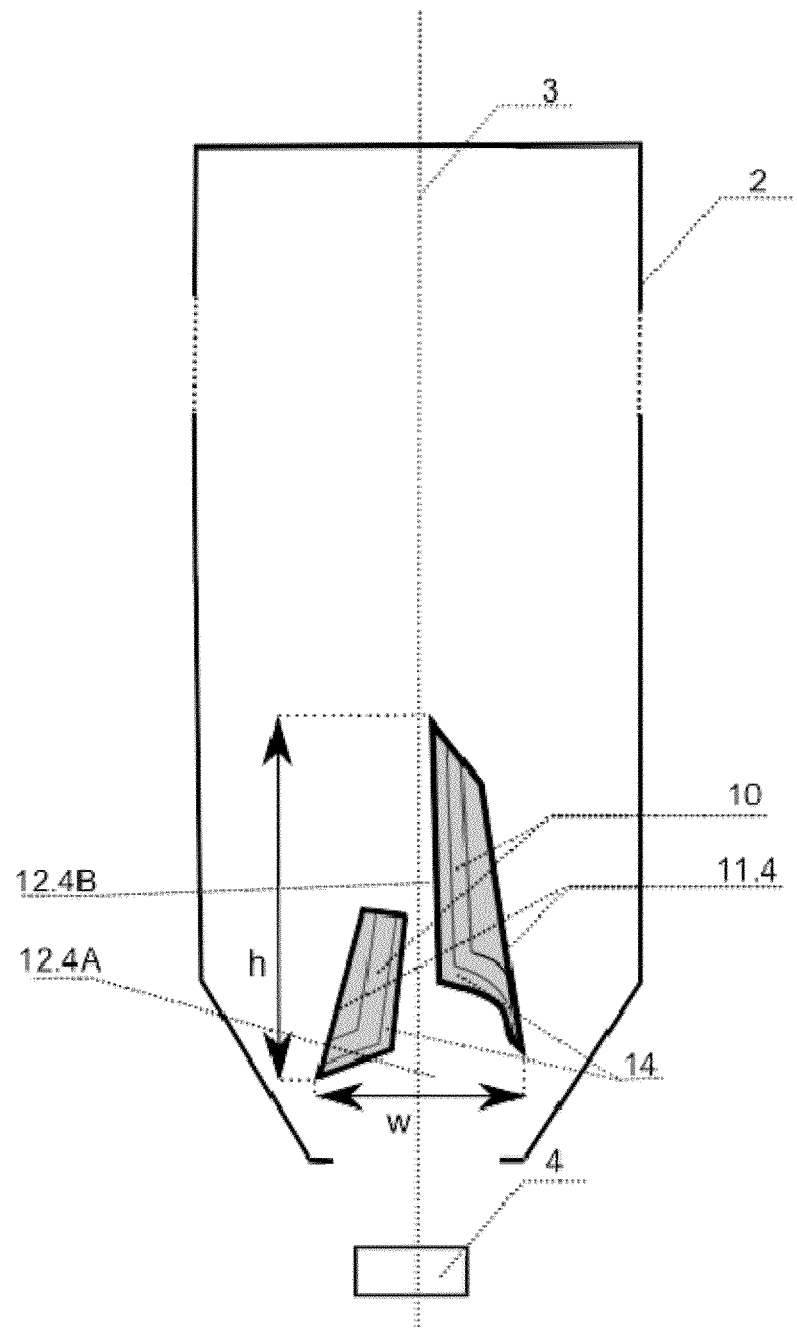

A vertical cross-section of a different shape of the detector body, which is not axially symmetrical, is shown in FIG. 3.

Figure 4:
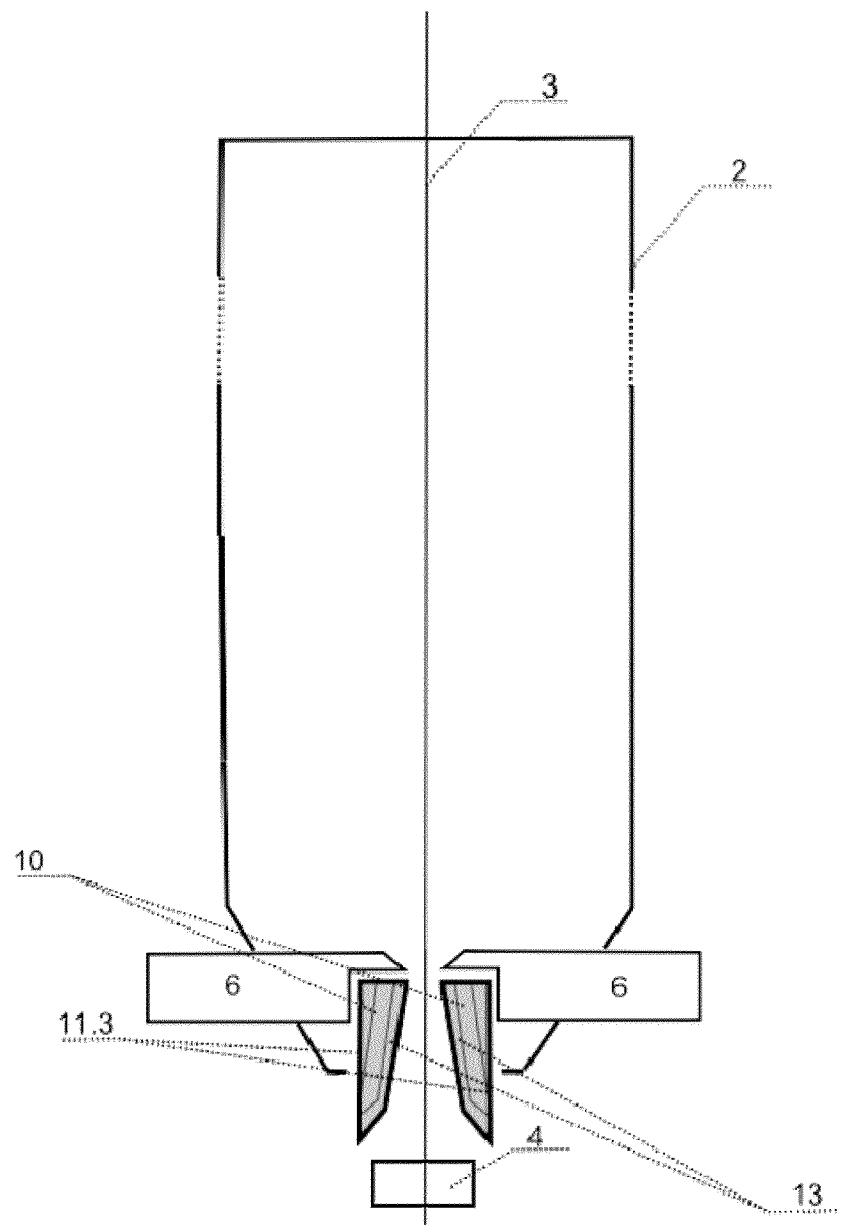

In FIG. 4 the detector body partly protrudes from the column.

Figure 5:
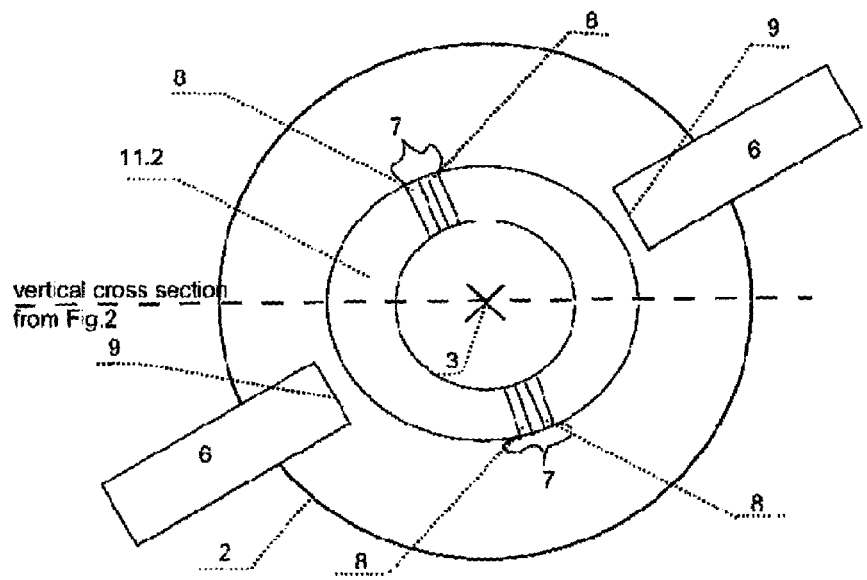

FIG. 5 is a horizontal cross-section of the hollow part divided by grooves into segments.

Figure 6:
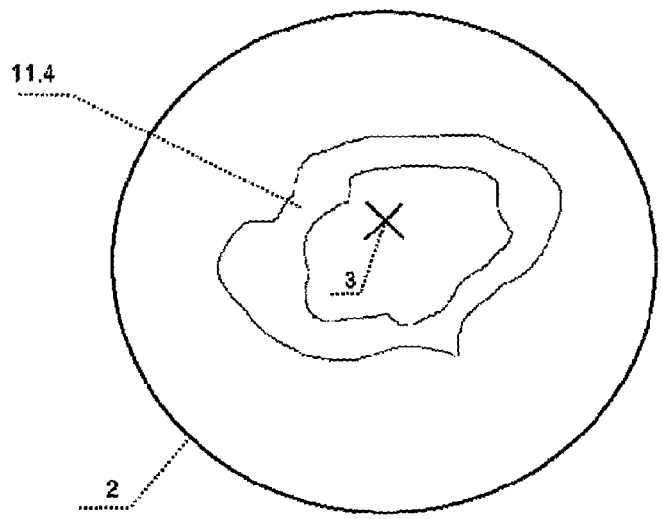
Figure 7:
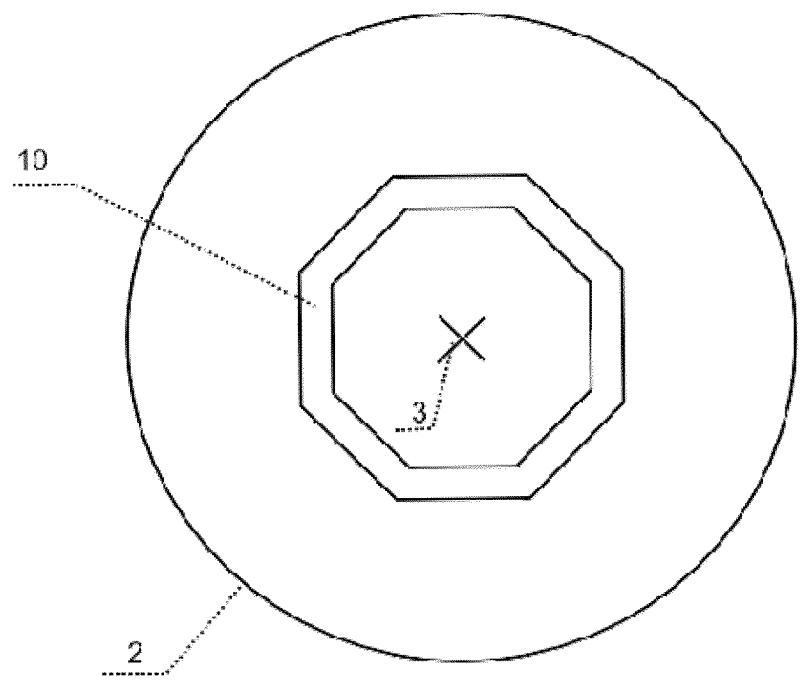

In FIG. 6 one of the horizontal cross-sections of the hollow part illustrates an example of an asymmetrical hollow part FIG. 7 is an example of a cross-section of the active scintillating layer, which is axially symmetrical around the longitudinal axis.

Figure 8A:
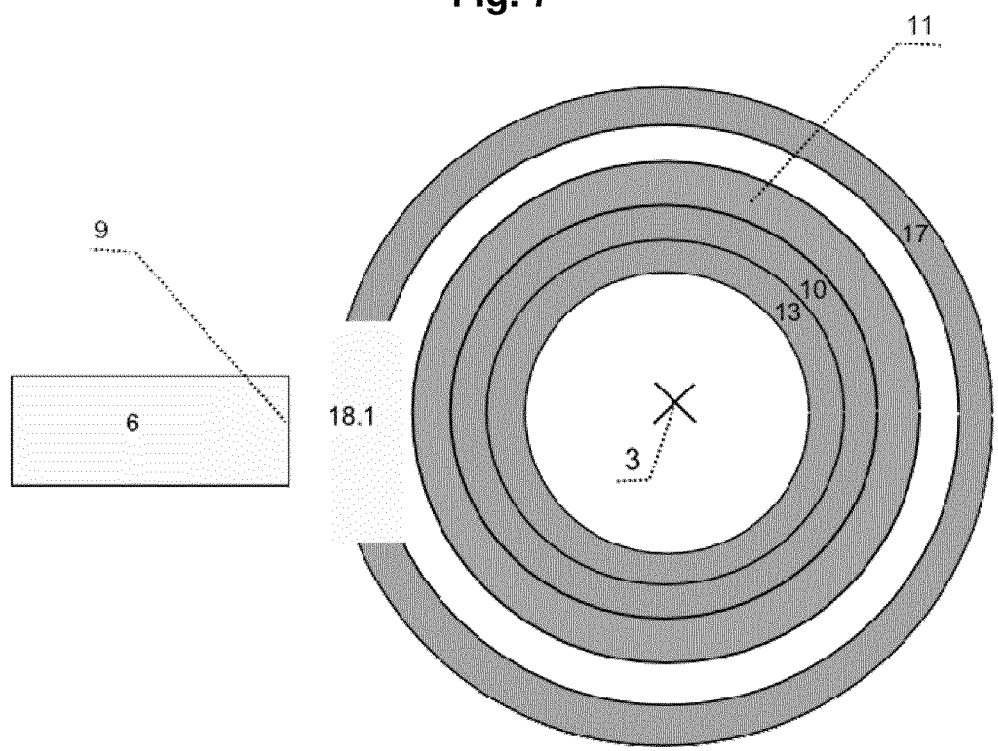
Figure 8B:
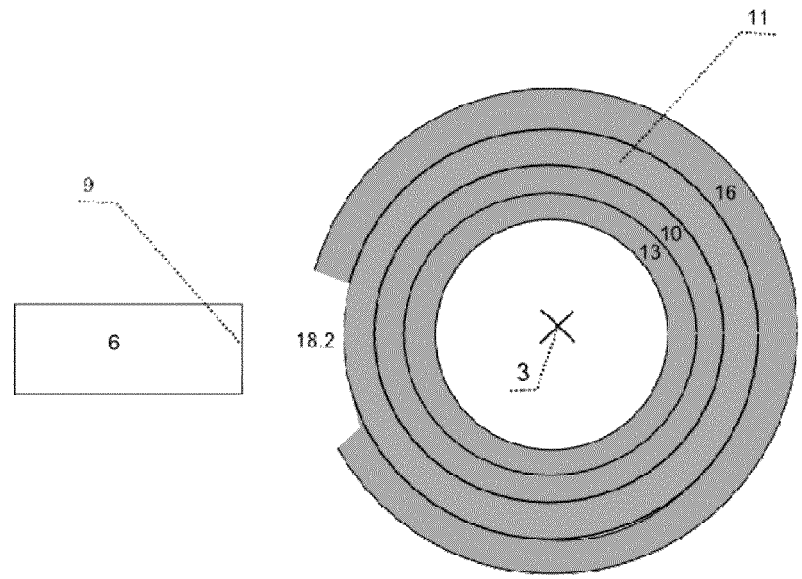
Figure 8C:
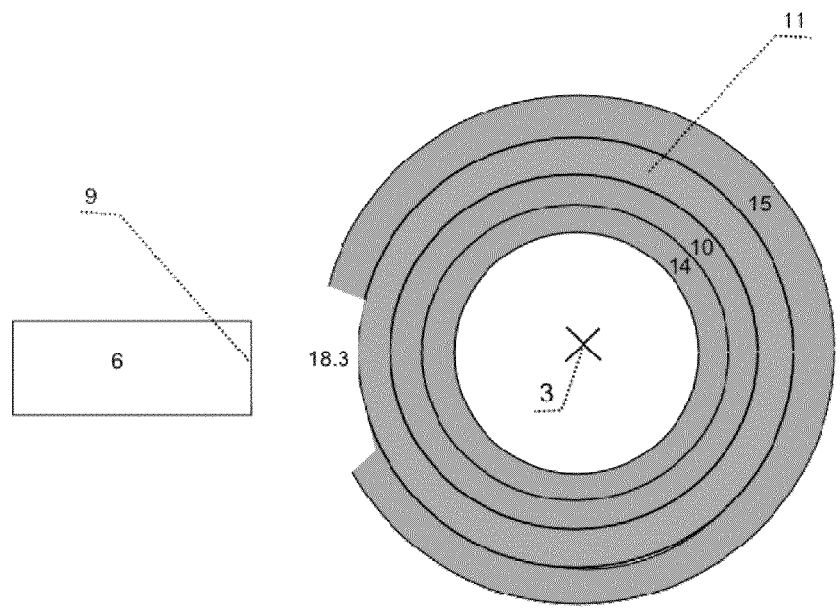

FIGS. 8a to 8c are examples of a horizontal cross-section of the hollow part with various combinations of conductive or dielectric reflective layers and/or reflective material applied to it.

DETAIL DESCRIPTION OF THE PREFERRED EMBODIMENTS

Figure 1:
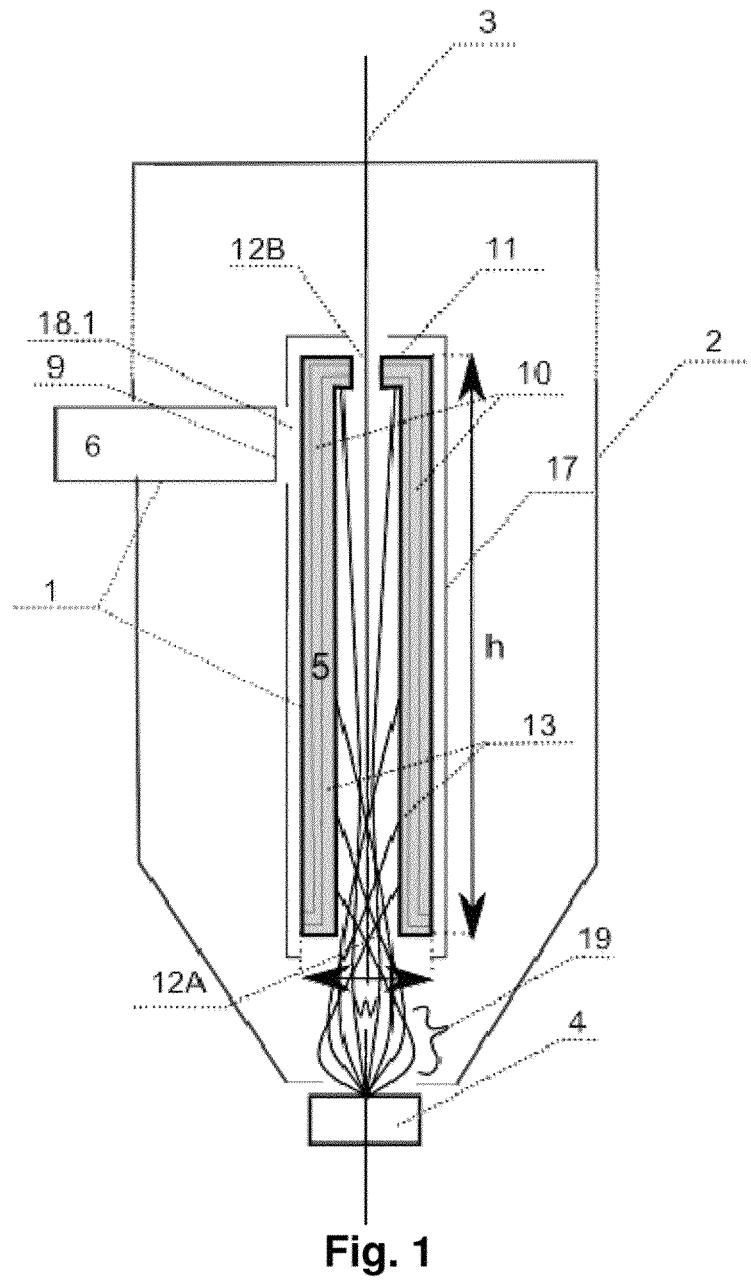
FIG. 1 is an example of a scintillation detection unit, the body of which consists of only one hollow part, together with a schematic illustration of some BSE trajectories leading from the sample to the body of the detector.

An example of a scintillation detection unit 1, the body 5 of which consisting of a single hollow part 11 is completely inserted inside the column 2, is depicted in FIG. 1. In this particular case the hollow part 11 is placed symmetrically around the longitudinal axis 3 of the column 2. However, the symmetrical position is not a condition. The hollow part 11 is in this case identical with the body 5 of the scintillation detection unit 1 and its end is situated above the examined sample 4. The hollow part 11 is provided, in the direction of the passage of the electrons from the sample 4, with a bottom hole 12A and a top hole 12B, passed through by the longitudinal axis 3. The condition that the height of the hollow part 11 measured in the direction of the longitudinal axis 3 is greater than one-and-a-half times its greatest width w in the direction perpendicular to the longitudinal axis 3 is satisfied. The cross-section in the illustration has been selected so that it clearly shows the greatest width, which means that in all the other vertical cross-sections the width would be the same or less. Situated in close vicinity to the hollow part 11 is the inlet 9 of the system 6 for processing the light signal, which may consist of a photodetector or a photodetector preceded by other optical elements, not marked in the drawing for greater simplicity. The inlet 9 can be, for example, the inlet window of the photodetector or the inlet surface of the first optical element. The photodetector may be, for example, a PMT-type photomultiplier, any type of a photodiode, etc. The preceding optical element may be, for example, a lightguide, an optical fibre, a lens or another part form optically suitable material or their combination, including also the possible gaps between the elements. The same applies to the systems 6 marked in the other pictures. In this particular case the hollow part 11 is fitted, on the wall on the reverse side from the longitudinal axis 3 with reflective material 17 with reflectivity of at least 30% in the spectral region in which the particular scintillation material radiates. The gap between the walls of the hollow part 11 on the reverse side from the longitudinal axis 3 and reflective material 17 is filled with the existing environment in the column 2, typically vacuum or diluted gas. The reflective material 17 here has the first hole 18.1 made in the area oriented opposite the inlet 9 of the system 6 for processing the light signal. Also depicted are the active scintillating layer 10 and the electrically conductive layer 13 on the surface adjacent to the longitudinal axis 3. For the sake of clarity, the active scintillating layer 10 and the electrically conductive layer 13 are marked only schematically—their widths are not to scale. The picture also gives an example of some BSE trajectories 19 moving away from the investigated sample 4 to the scintillation detection unit 1. They are drawn only schematically. The trajectories 19 are affected by the field of the objective lens and the scanning coils. The position of these elements is clear to people skilled in the art so it has been left out for simplicity. After passing between the polepieces of the objective lens the BSE are focused towards the longitudinal axis 3 of the column 2, they subsequently diverge and can also be influenced by the field of the scanning coils. Due to spherical and chromatic aberration the objective lens does not focus all of the BSE to a single spot. For simplicity, the picture only shows the influence of the spherical aberration, i.e. different energies of the individual BSE are not included. The diverging BSE after passing through the objective lens, and possibly the scanning coils, impinge, at various angles and at various heights, on the walls of the body 5 of the scintillation detection unit 1, which is here identical with the hollow part 11.

It is obvious that a large number of electrons impinge on the vertical walls of the hollow part 11. Another part of the electrons then impinges on the horizontal walls in the vicinity of the top hole 12B. The yield of the detector having this design is therefore much greater than with the solution based on a disc.

The operating principle of the device according to FIG. 1 is as follows: A beam of primary electrons moves downwards in the column 2 of an electron or ion microscope, having caused, after impinging on the sample 4, among other things, emission of BSE. These BSE move with various energies and at various angles from the sample 4 upwards. The majority of them impinge on the walls of the hollow part 11 and then pass through the electrically conductive layer 13 on their surface. This electrically conductive layer 13 serves to remove the surface charge and can be made, for example, of ITO, C, Al material or some other metals, etc. Instead of the electrically conductive layer 13 the removal of the surface charge can be effected through an electrically conductive grid 14, see FIG. 2. The BSE having passed through the electrically conductive layer 13 will then actuate light emission in the active scintillating layer 10, which is found underneath the electrically conductive layer 13. The active scintillating layer 10 is either a layer of powder, plastic or another scintillator or a layer at the surface of a scintillator crystal, e.g. YAG:Ce, YAP:Ce, BGO, YSO, etc., which the electrons penetrate before they are slowed down. The generated light then spreads either through the scintillation material only, including cases with an independently applied crystal, or plastic scintillator, or through the scintillation material and the substrate to which the scintillation material is applied, if any such substrate is used, whereby the substrate must be sufficiently permeable for the wavelengths of the emitted light. It is beneficial for conducting light when at least around a part of the body 5 of the scintillation detection unit 1 reflective material 17 is placed on the outside, ideally with a gap, where this gap is filled with the existing environment in the column 2, usually vacuum or diluted gas. A configuration with a gap makes it possible to take advantage of total reflection on the walls of the scintillator and/or substrate, the surfaces of which can benefit from being polished for this purpose, and also to capture even those rays that do not meet the condition for total reflection. Reflective material 17 can be either conductive or on the basis of dielectric layers. However, other configurations with reflective layers are also possible, as is depicted, for example, in FIGS. 8b and 8c. The reflective layer 17 has the first hole 18.1 through which light comes out into the area oriented opposite the inlet 9 of the system 6 for processing the light signal. If multiple systems 6 for processing the light signal are engaged, an adequate number of first holes 18.1 must be used. The top holes 12B and the bottom holes 12A for the passage of the primary beam of electrons remain even when reflective layer 17 is employed, which is interrupted in this area. The wall of the crystal or substrate, which is oriented towards the inlet 9 of the system 6 for processing the light signal, can benefit from being made with a matt surface, which assures that maximum light comes out. The light spreading as described above is subsequently captured by the system 6 for processing the light signal, which after further electronic processing produces an image of the individual points on the sample 4. In the system 6 for the processing of the light signal the light impinges directly on the photodetector, i.e. a photomultiplier, a photodiode, etc. or, when the photodetector may need to be placed farther away from the body 5 of the scintillation detection unit 1, the light is led to the photodetector, for example, by a lightguide or other optical elements. The signal from the photodetector is further electronically processed, whereby the final output, containing information on the given point on the sample, usually appears on the monitor of a computer. Obtaining information on other points on the sample proceeds in a similar way—the primary beam is diverted in 2 directions, usually perpendicular to each other, until it scans the selected area on the sample 4. From each point of impact a signal is obtained in the manner described above, so that the result is acquiring information on the whole scanned area of the sample 4.

The design according to FIG. 1 is an ideal example of embodiment where the hollow part 11 can advantageously serve as a part of a vacuum-sealed jacket around the primary beam of electrons.

In the other implementations of the invention, the basic principles of the distribution of the electrons and light are identical to the simplest design according to FIG. 1. In addition, the examples of suitable scintillator and conductive materials in more complicated designs are identical to those listed above. The following descriptions will therefore only concentrate on the differences in the operation of more complicated realizations compared to the operation of the simplest arrangement depicted in FIG. 1 and described above.

In all of the figures, the widths of the marked layers are not to scale and are depicted only schematically in order to make clear how they are arranged in space relative to one another. Also the shape of the active scintillation layer 10 is depicted schematically for clarity. In reality, for example, when using a scintillator crystal shaped as a hollow cylinder according to FIG. 1, placed symmetrically along the longitudinal axis 3, the thickness of the active scintillating layer 10, in which light emission occurs, becomes slightly narrower alongside the vertical walls in the upward direction, as high above the lens the BSE impinge on the surface almost tangentially, so that in the direction perpendicular to the wall surface they do not penetrate so deeply into the material. The situation is similar with the shape of the active scintillation layer 10 and with other shapes of the hollow parts. For the sake of clarity, the pictures also disregard various finishes such as polishing, matting, etc.

Figure 2:
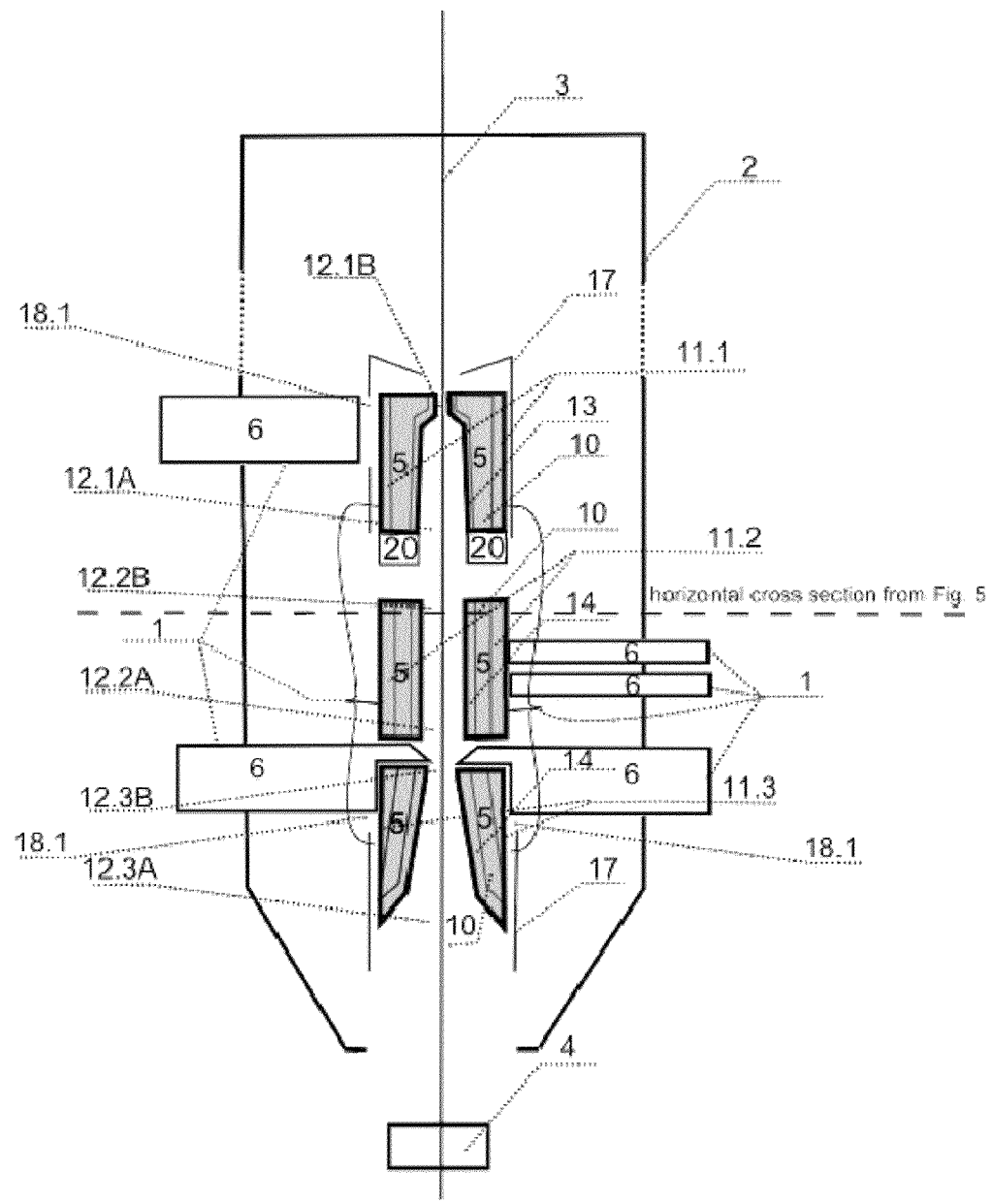
FIG. 2 shows a more complicated arrangement of the scintillation detection unit, the body of which in this case is made up of three hollow parts, one of which being optically shielded from the others.

An example of a more complicated implementation of the scintillation detection unit 1 is shown schematically in FIG. 2. Here, the body 5 is made up of three hollow parts, all of which are inserted inside the column 2 and in the close vicinity of which systems 6 for processing the light signal are situated. For simplification their inlets 9 are omitted and they are all marked with the same reference number 6. The body 5 consists of the first hollow part 11.1 with a single system 6 for processing the light signal, the second hollow part 11.2 with two systems 6 for processing the light signal and the third hollow part 11.3 with two systems 6 for processing the light signal. It should be noted that the illustration only captures the arrangement in this vertical cross-section, while other systems 6 can be distributed around the longitudinal axis 3 in such a way that they are not visible in this cross-section. In other cross-sections, the device may also exhibit a lesser degree of symmetry. While FIG. 2 captures only one of many possible arrangements of the elements, in reality there can be any number of systems 6 associated with each of the hollow parts 11.1, 11.2 and 11.3, and also any number of the actual hollow parts 11.1, 11.2 and 11.3. Depicted in FIG. 2 are the bottom hole 12.1A and the top hole 12.1B of the first hollow part 11.1, the bottom hole 12.2A and the top hole 12.2B of the second hollow part 11.2 and the bottom part 12.3A and the top part 12.3B of the third hollow part 11.3. The arrangement of the hollow parts 11.1, 11.2 and 11.3 shown here can naturally be reordered as necessary. The first hollow part 11.1 and the third hollow part 11.3 in this model arrangement are furnished with reflective material 17, which can be conductive or dielectric, separated by a gap from the hollow parts 11.1 and 11.3. The reflective material 17 is fitted with the first holes 18.1 situated opposite the inlet of their related systems 6 for processing the light signal. Regardless of using the reflective material 17 the bottom holes 12.1A, 12.2A and 12.3A and the top holes 12.1B, 12.2B and 12.3B must be preserved to allow for the passage of the primary beam of the electrons. As can be seen in FIG. 2, the height h of the body 5 measured in the direction of the longitudinal axis 3, which in this case represents a simple sum of the projections of the first to third hollow parts 11.1, 11.2 and 11.3 on the longitudinal axis 3, is greater than one-and-a-half times the greatest width w, measured perpendicular to the longitudinal axis 3, of the hollow part in which this parameter is the largest, whereby in this model arrangement the greatest widths of all the hollow parts 11.1, 11.2 and 11.3 are the same in the cross-section pictured here. FIG. 2 also shows an example of optical shielding of the first hollow part 11.1 using a reflective layer 20. The reflective layer 20 reflects part of the light back into the first hollow part 11.1, where it is beneficial that the reflective part of light is as large as possible, i.e. that the reflective layer 20 has the greatest possible reflectivity in the spectral area, in which the scintillator used for the first hollow part 11.1 emits. This ensures that the signal received by the system 6 for processing the light signal associated with the first hollow part 11.1 mostly corresponds only to the electrons impinging on the first hollow part 11.1 and thus allows for their selective detection separated by height. A similar method can be used to shield the second and the third hollow parts 11.2 and 11.3 and any other hollow parts possibly engaged. It is also possible not to apply the reflective layer 20 directly on the particular hollow parts 11.1, 11.2 and 11.3 and others, but instead on an additional part that will be inserted between the particular hollow parts 11.1, 11.2 and 11.3. FIG. 2 also shows electrically conductive layers 13 and an electric conductive grid 14 on the walls of the hollow parts 11.1, 11.2 and 11.3 adjacent to the longitudinal axis 3. For clarity, reference lines are drawn only to the layers on the right-hand side from the longitudinal axis 3, given that the arrangement of the to electrically conductive layers 13 and electrically conductive grids 14 to the left of the longitudinal axis 3 in this example is axially symmetrical along the longitudinal axis 3. It is only one of many model arrangements of the electrically conductive layers 13 and electrically conductive grids 14, which in other embodiments can occur in different combinations on the hollow parts. Employing an electrically conductive grid 14 may be beneficial for the detection of lower energy electrons, although it is more technologically demanding.

FIG. 2 also illustrates the active scintillating layers 10, for clarity again only on the right-hand side from the longitudinal axis 3, where in this arrangement the active layer 10 is axially symmetrical along the longitudinal axis 3. For greater clarity, the inlets 9 to systems 6 for processing the light signal are omitted here.

In a similar type of embodiment of multiple hollow parts above one another, it is naturally possible to use, on different hollow parts in different combinations, alongside reflective material 17 separated by a gap, the first reflective layer 15, conductive or dielectric, applied directly to at least part of the walls of the particular hollow parts 11.1, 11.2 and 11.3 on the opposite side from the longitudinal axis 3, and possibly a dielectric reflective layer 16, for example, in the form of a foil, which tightly wraps around at least part of the walls of the particular hollow parts 11.1, 11.2 and 11.3 on the opposite side from the longitudinal axis 3. At the same time, it is possible to make an embodiment where the projections of the hollow parts situated one above the other partly overlap. In this case, when measuring the height of the detector body in the direction along the longitudinal axis 3 the sections of the projections of the hollow parts 11.1, 11.2 and 11.3 on the longitudinal axis 3 that overlap are added only once. The hollow parts 11.1, 11.2 and 11.3 can be made of various materials.

The advantage of arranging the hollow parts 11.1, 11.2 and 11.3 above one another is the possibility of separately detecting BSE that impinge on areas at various heights.

FIG. 3 shows another possible shape of the hollow part here marked as the fourth hollow part 11.4, which is not symmetrical relative to the longitudinal axis 3. The fourth hollow part 11.4 is depicted in a vertical cross-section, in which its width measured perpendicularly to the longitudinal axis 3 is greatest. As can be seen from FIG. 3, it is again compliant with the condition that the height h of the body 5 measured in the direction of the longitudinal axis 3 is greater than one-and-a-half times the greatest width w of the hollow part making up the body 5 measured in the direction perpendicular to the longitudinal axis 3. The active scintillating layer 10 and the electrically conductive grid 14 are drawn only schematically. The latter can also be replaced with an electrically conductive layer 13. The optional layers and coatings such as the first reflective layer 15, the dielectric reflective layer 16 or reflective material 17 are omitted for the sake of clarity, as is the system 6 for processing the light signal. If, for example, two hollow parts of a similar type as the hollow part 11.4 depicted in FIG. 3 were placed closely one above the other, it would be an example of a variant in which the projections of the hollow parts on the longitudinal axis 3 partly overlap.

FIG. 4 is an example of the design of the scintillation detection unit 1, where its body 5 protrudes from the column 2. Here, the body 5 is identical to the third hollow part 11.3 and is equipped with two systems 6 for processing the light signal. It is only one of the many possible arrangements and, naturally, even in the configuration with the body 5 protruding from the column 2 it is possible to use other shapes, materials and combinations of hollow parts, different configurations of the systems 6 for processing the light signal and various combinations of layers and materials such as the first reflective layer 15, the dielectric reflective layer 16 and reflective material 17, as well as the electrically conductive layers 13 or electrically conductive grids 14. Again, the inlets 9 of the systems 6 for processing the light signal are not marked in order to simplify the drawing.

FIG. 5 is a drawing of a horizontal cross-section of the second hollow part 11.2 from FIG. 2, which is divided by grooves 7 into two segments, whereby each of the segments is assigned one system 6 for processing the light signal. It should be noted that systems 6 for processing the light signal in FIG. 5 are not identical with the systems drawn in the horizontal cross-section in FIG. 2. Grooves 7 are coated with the second reflective layers 8 with a reflectivity of at least 30%, or higher if possible, in the spectral region corresponding to the emission spectra of the scintillator used for the second hollow part 11.2, providing optical shielding for the segments. The thickness of the layers is again illustrated only schematically. Grooves 7 can even be completely filled up with the second reflective layer 8. The second reflective layer 8 reflects light back to the segment that is next to it. This arrangement is only one of many. The second reflective layers 8 are not a condition. It is beneficial to use a division into a higher number of segments than are depicted, where each of them is assigned at least one system 6 for processing the light signal.

This arrangement allows for selectively detecting BSE within a particular angle range and in combination with the arrangement according to FIG. 2 it enables simultaneous separation of the detected BSE by height and angle.

For simplicity the drawing does not include the electrically conductive layer 13 or the electrically conductive grid 14, or the other layers such as the first reflective layer 15 or the dielectric reflective layer 16 and the reflective material 17, nor various types of finish, such as polishing, matting, etc.

FIG. 6 shows, as an example of an asymmetrical hollow part, one of the horizontal cross-sections of the fourth hollow part 11.4 from FIG. 3, where the active scintillating layer 10 associated with the fourth hollow part 11.4 may exhibit a similar asymmetry to the inner surface of the hollow part.

FIG. 7 is an example of a cross-section of the active scintillating layer 10, which is axially symmetrical around the longitudinal axis 3. The axially symmetrical scintillator layers 10 can naturally have different cross-sections and can even be rotationally symmetrical, i.e. with a horizontal cross-section in the form of concentric rings.

FIG. 8a is an illustration of a horizontal cross-section of the basic hollow part 11, showing one of the possible arrangements of the layers. The picture shows the same arrangement of the layers in the horizontal cross-section as is depicted in FIG. 1 in vertical cross-section. The hollow part 11 in this model arrangement is coated with an electrically conductive layer 13 on the inner surface and outer reflective material 17 separated by a gap. It also shows the active scintillating layer 10. The electrically conductive layer 13 can be replaced by the electrically conductive grid 14. The first hole 18.1 in the reflective material 17 is oriented towards the inlet 9 of the system 6 for processing the light signal. The shape of the first hole 18.1 shown in FIG. 8 depicts only one of the many possible shapes.

In some cases it may be appropriate to leave out the gap, particularly if required due to space requirements and when the reflectivity of the reflective material is very high, and to use the first reflective layer 15 applied directly to the walls of the substrate or the scintillator on the reverse side from the longitudinal axis 3 or alternatively tightly wrap the walls around with a dielectric reflective layer 16, usually in the form of a foil, as is shown in FIGS. 8b and 8c. They are alternatives different from the example illustrated in the vertical cross-section in FIG. 1.

FIG. 8b captures the arrangement of the layers in the hollow part 11 tightly wrapped around with a dielectric reflective layer 16 around the walls on the reverse side from the longitudinal axis 3, also showing the second hole 18.2 in the dielectric reflective layer 16, oriented towards the inlet 9 of the system 6 for processing the light signal. The electrically conductive layer 13 on the outer surface is also depicted.

FIG. 8c shows the arrangement of the layers in a hollow body 11 coated with the first reflective layer 15 around the walls on the reverse side from the longitudinal axis 3, also marking the third hole 18.3 in the first reflective layer 15, oriented towards the inlet 9 of the system 6 for processing the light signal. To illustrate another of the possible combinations the electrically conductive layer 13 on the inner surface is replaced with the electrically conductive grid 14.

It should be stressed that, in the case of using multiple hollow parts, the arrangement of the layers according to FIGS. 8a, 8b and 8c can be applied to the individual hollow parts in various combinations. The presence of the reflective material 17, the dielectric reflective layer 16 and the first reflective layer 15 is not a requirement for the functioning of the invention, although it increases its efficiency. Nor is it necessary that the reflective parts completely surround the hollow parts. For the sake of clarity FIG. 8a-c omit the column 2 and other elements that are not significant for the depiction of the layer arrangement.

Industrial Applicability

The presented invention makes it possible to construct a scintillation detection unit for BSE detection in electron and ion microscopes that has a great energy and angle range as well as high overall efficiency and in addition enables separating the detected electrons by height and angle. An additional benefit is using an arrangement where the unit body is a part of a vacuum-sealed jacket around the primary beam of electrons.

The invention claimed is:

1. A scintillation detection unit for the detection of backscattered electrons for electron and ion microscopes having a column with a longitudinal axis, in which the scintillation detection unit consists of a body and at least one system for processing the light signal generated by a photodetector or a photodetector preceded with additional optical members where the inlet of this system is situated in close vicinity to the body of the scintillation detection unit and where the body is at least partly made of scintillation material, in which the body of the scintillation detection unit is at least partly situated in the column of an electron or ion microscope and is made up of at least one hollow part, where in the lower base of each hollow part bottom holes are made and in the upper base of each hollow part top holes are made for the passage of the primary beam of charged particles, while the longitudinal axis passes through the hollow, the bottom holes and the top holes, where height of body of scintillation detection unit measured in the direction of longitudinal axis is greater than one-and-a-half times the greatest width, measured in the direction perpendicular to longitudinal axis, of the hollow part with the greatest width, while in the case of using multiple hollow parts making up body its height in the direction of the longitudinal axis is given by the sum of the projections of the hollow parts employed on the longitudinal axis, where in the case that some of the projections overlap, the overlapping sections are added only once to the overall height and where the surface layers of the hollow part adjacent to longitudinal axis are either completely made up of active scintillating layer, or the active scintillating layer is at least partly applied to the surfaces of the hollow parts, while the bottom end of body of the scintillation detection unit is situated above the examined sample wherein the walls of the hollow parts are vacuum-sealed in the areas outside bottom holes and top holes and make up part of a vacuum-sealed jacket around the longitudinal axis, which is passed through by the primary beam of electrons.

2. A scintillation detection unit according to claim 1 wherein at least one of hollow parts is provided with grooves, where the longitudinal axis of the grooves is in the plane passing through the longitudinal axis, and where the grooves divide the corresponding hollow part into several segments and where each of the segments is assigned its own system for processing the light signal.

3. A scintillation detection unit according to claim 2 wherein the surface of grooves is coated with the second reflection layers that exhibit, towards the segments of the particular hollow part, reflectivity of at least 30% in the spectral region in which the scintillation material used for the corresponding hollow part radiates.

4. A scintillation detection unit according to claim 1 wherein hollow parts are at least partially optically shielded from one another.

5. A scintillation detection unit according to claim 4 wherein the optical shield is implemented using the third reflection layers, the reflectivity of which is at least 30% in the spectral region in which the scintillation material of the hollow part adjacent to the given third reflective layer radiates.

6. A scintillation detection unit according to claim 1 wherein hollow parts are made of scintillation material, an integral part of which is an active scintillating layer and/or a substrate from light conducting material, to the inner surface of which a layer of scintillation material constituting active scintillating layer is applied.

7. A scintillation detection unit according to claim 6 wherein the scintillation materials and/or substrates and/or layers of scintillation material are different in at least two of the hollow parts.

8. A scintillation detection unit according to claim 1 wherein in the case that the hollow part is made up of scintillation material an integral part of which is an active scintillating layer, its surfaces adjacent to the longitudinal axis of the column are polished.

9. A scintillation detection unit according to claim 1 wherein the active scintillating layer is, on the side adjacent to longitudinal axis, coated with an electrically conductive layer for the removal of surface charge.

10. A scintillation detection unit according to claim 1 wherein at least some area of the walls of at least one hollow part on the reverse side from the longitudinal axis is coated with a first reflective layer with reflectivity optimised for the wavelength of the emission of the scintillation material used for this hollow part, whereby the first reflective layer is provided with the third holes in areas oriented opposite the inlet of each of the systems for processing the light signal.

11. A scintillation detection unit according to claim 1 wherein at least some area of the walls of at least one hollow part on the reverse side from the longitudinal axis is tightly coated with a dielectric reflective layer with reflectivity optimised for the wavelength of the emission of the scintillation material used for this hollow part, whereby this dielectric reflective layer is provided with the second holes in the areas oriented opposite the inlet of each of the systems for processing the light signal.

12. A scintillation detection unit according to claim 1 wherein at least some area of the walls of at least one hollow part on the reverse side from longitudinal axis is polished.

13. A scintillation detection unit according to claim 1 wherein at least some area of the walls of at least one hollow part on the reverse side from longitudinal axis is surrounded by reflective material with a reflectivity of at least 30% in the spectral region in which the particular scintillation material radiates, whereby there is a gap between the walls of the corresponding hollow part on the reverse side from longitudinal axis and reflective material filled with the existing environment in the column, typically vacuum or diluted gas, and where this reflective material has first holes in the areas oriented opposite inlet of each of the systems for processing the light signal.

14. A scintillation detection unit according to claim 13 wherein the reflective material is on the basis of dielectric layers.

15. A scintillation detection unit according to claim 1 wherein in the areas oriented opposite the inlet of each of the systems for processing the light signal the external surface of the particular hollow part is matt.

* * * * *